(12) United States Patent
Aota et al.

(10) Patent No.: US 6,881,684 B2
(45) Date of Patent: Apr. 19, 2005

(54) METHOD OF FORMING SILICON NITRIDE DEPOSITED FILM

(75) Inventors: Yukito Aota, Kanagawa (JP); Masahiro Kanai, Kanagawa (JP); Atsushi Koike, Kanagawa (JP); Tomokazu Sushihara, Chiba (JP)

(73) Assignee: Canon Kabushiki Kaisha, Tokyo (JP)

( * ) Notice: Subject to any disclaimer, the term of this patent is extended or adjusted under 35 U.S.C. 154(b) by 31 days.

(21) Appl. No.: 10/650,710

(22) Filed: Aug. 29, 2003

(65) Prior Publication Data

US 2004/0043637 A1 Mar. 4, 2004

(30) Foreign Application Priority Data

Sep. 2, 2002 (JP) ........................................ 2002-256768

(51) Int. Cl.[7] ........................ H01L 21/31; H01L 21/469
(52) U.S. Cl. ........................ 438/791; 438/792; 438/38
(58) Field of Search ................................ 438/791, 792, 438/38

(56) References Cited

U.S. PATENT DOCUMENTS

| | | | |
|---|---|---|---|
| 5,643,834 A * | 7/1997 | Harada et al. | 438/122 |
| 5,720,826 A | 2/1998 | Hayashi et al. | 136/249 |
| 6,326,304 B1 | 12/2001 | Yoshimi et al. | 438/680 |
| 6,413,887 B1 * | 7/2002 | Fukuda et al. | 438/792 |
| 6,526,910 B2 | 3/2003 | Yajima et al. | 118/723 E |
| 2001/0029893 A1 | 10/2001 | Yajima et al. | 118/723 E |
| 2002/0006477 A1 | 1/2002 | Shishido et al. | 427/569 |
| 2002/0039832 A1 | 4/2002 | Yajima et al. | 438/485 |
| 2003/0027369 A1 * | 2/2003 | Yamazaki | 438/21 |
| 2003/0066485 A1 * | 4/2003 | Yamazaki et al. | 118/723 E |
| 2003/0070759 A1 | 4/2003 | Aota et al. | 156/345.43 |
| 2004/0127069 A1 * | 7/2004 | Yamazaki et al. | 438/778 |

FOREIGN PATENT DOCUMENTS

JP          09-289210          11/1997

* cited by examiner

*Primary Examiner*—Alexander Ghyka
(74) *Attorney, Agent, or Firm*—Fitzpatrick, Cella, Harper & Scinto

(57) ABSTRACT

A plate high-frequency electrode for supplying a high-frequency power of the VHF band and a grounding electrode are disposed in opposition to each other at an interval of less than 8 mm in a vacuum vessel; at least a silane-based gas and nitrogen gas as source gases are introduced into a reaction space of the vacuum vessel, and a silicon nitride deposited film is formed with the pressure of the reaction space being kept at 40 to 133. Thereby, a silicon nitride film with good quality can be obtained.

8 Claims, 3 Drawing Sheets

METHOD OF FORMING SILICON NITRIDE DEPOSITED FILM

BACKGROUND OF THE INVENTION

1. Field of the Invention

The present invention relates to a method of forming a silicon nitride deposited film as a highly functional passivation film, utilizing a high-frequency discharge under low-temperature conditions, particularly to a method of forming a silicon nitride deposited film mainly on a product having an organic film or made using a resin substrate.

2. Related Background Art

In recent years, there is a need for passivation films for organic electroluminescent (EL) devices or products having semiconductor films formed on resin substrates.

With these products, it is essential to form deposited films under temperature conditions of about 100° C. or lower, which has not been required in the formation of gate insulating films or passivation films of the conventional thin film transistors.

Hitherto, silicon nitride films used mainly as insulating films or passivation films have been formed by the plasma CVD that uses a high-frequency plasma of a frequency of 13.56 MHz or a further higher frequency such as VHF and decomposes a mixed gas of silane, ammonia and nitrogen to deposit a film. Further, high-speed film forming method of forming silicon nitride films has been realized in which the plasma exciting frequency has been increased from 13.56 MHz in the HF band to 30 MHz or more in the VHF band. The formation of these silicon nitride films is usually carried out by supplying a large electric power to the plasma while heating the substrate at about 300° C.

However, with organic EL devices or products using semiconductors or resin materials of poor heat resistance, the use of the conventional silicon nitride film forming method that uses a large electric power while heating the substrate to high temperatures has poses a problem of breakage of organic matters or deformation of resin members due to ion bombardment or heat of the plasma.

Further, when silicon nitride films are to be formed by the conventional method without heating the substrate, there have been created problems such as generation of film peeling off, low deposition rates of 1–2 Å/sec or less, and formation of a large amount of silicon polymer powder that necessitates frequent cleaning of the interior of the chamber to decrease the operating rate of the production system and degrades the product quality.

As described so far, with the conventional method, it is difficult to form passivation films for organic films or semiconductors, which are less resistant to ion bombardment or heat of plasma.

Japanese Patent Application Laid-Open No. 9-289210 discloses a method of forming a silicon nitride film. This publication reports that high-speed film formation has been realized by setting the plasma frequency at 30 MHz to 100 MHz, setting the gas pressure of the atmosphere for film formation within the range of 50 Pa to 180 Pa and establishing such a condition as to satisfy the relation of (S/F) <30 when defining the area of a substrate holder as S ($cm^2$) and defining the flow rate of monosilane as F substrate area ($cm^2$) for film deposition to the flow rate (sccm) of monosilane gas to less than 30, that is, to supply a large amount of monosilane relative to the substrate area for film deposition, thereby achieving high-speed film formation in a large area.

U.S. Pat. No. 6,326,304 discloses a method of producing an amorphous silicon-based thin film photoelectric converter using a silane-based gas and a dilution gas containing hydrogen.

According to this patent, the film-forming rate is improved and the utilization efficiency of source gases is increased by forming an amorphous silicon-based thin film under such conditions that the partial pressure of the silane-based gas in the plasma CVD reaction chamber ranges from 1.2 Torr to 5.0 Torr, and the interval between a surface of a substrate mounted on one electrode and a surface of the other electrode ranges from 8 mm to 15.

However, even with the methods disclosed in Japanese Patent Application Laid-Open No. 9-289210 and U.S. Pat. No. 6,326,304, although high speed film formation can be realized, it is difficult to attain formation of a silicon nitride film with good film quality at low temperatures, film formation with less damage to semiconductor films, and prevention of the deformation of resin members, which the present inventors have been seeking.

SUMMARY OF THE INVENTION

Therefore, in the light of the above-mentioned problems, the present inventors have directed their research efforts to attainment of formation of a silicon nitride film with good film quality at low temperatures, film formation with less damage to semiconductor films, and prevention of the deformation of resin.

To resolve the above-mentioned problems, the present invention provides a method of forming a silicon nitride deposited film using the capacitive coupled plasma enhanced CVD process, which comprises disposing a plate high-frequency electrode for supplying a high-frequency power of the VHF band and a grounding electrode in opposition to each other at an interval of less than 8 mm in a vacuum vessel, introducing at least a silane-based gas and nitrogen gas as source gases into a reaction space of the vacuum vessel, and forming a silicon nitride deposited film with the pressure of the reaction space being kept at 40 to 133 Pa.

In the present invention, it is preferred that the density of a power supplied to the high-frequency electrode is 40 to 150 $mW/cm^2$.

Further, it is preferred that the flow rate of the nitrogen gas is 10 to 30 times that of the silane-based gas.

Moreover, it is preferred that the temperature of a substrate on which the silicon nitride film is deposited is 80° C. or less.

Further, it is preferred that the silicon nitride film is formed on another deposited film comprising an organic film.

The present invention also provides a method of producing an organic electroluminescent device having an organic electroluminescent element provided on a substrate, comprising:

the element forming step of forming on a substrate an organic electroluminescent element comprising a pair of electrodes and an organic material interposed between the pair of electrodes; and the silicon nitride film forming step, subsequently to the element forming step, of forming a silicon nitride film so as to cover the organic electroluminescent element, wherein the silicon nitride film forming step comprises disposing a plate high-frequency electrode for supplying a high-frequency power of the VHF band and a grounding electrode in opposition to each other at an interval of less than 8 mm in a vacuum vessel, introducing at least a silane-based gas and nitrogen vacuum vessel, and forming a silicon nitride film with the pressure of the reaction space being kept at 40 to 133 Pa.

DETAILED DESCRIPTION OF THE PREFERRED EMBODIMENTS

Figure 1:
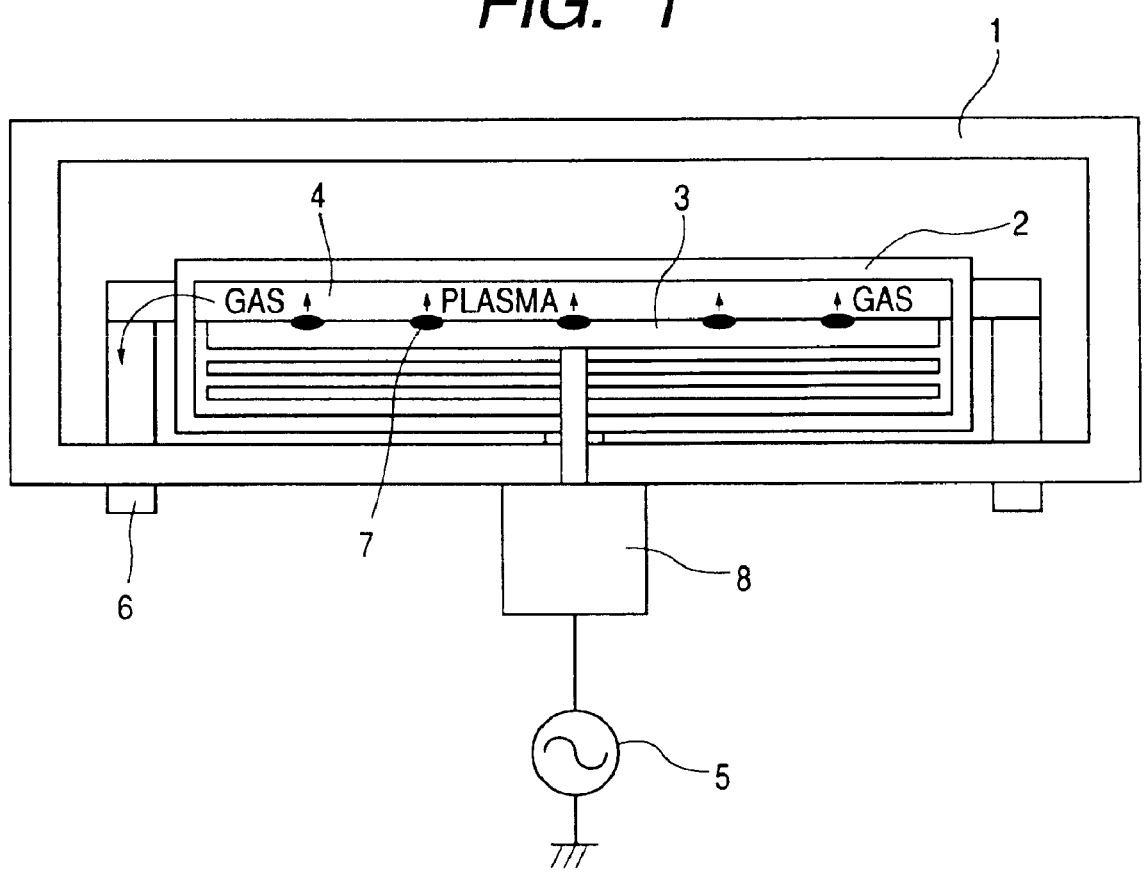
FIG. 1 is a schematic cross-sectional view of a deposited film forming apparatus for practicing an embodiment of the silicon nitride film forming method of the present invention.

To form a silicon nitride deposited film efficiently on a substrate and further to form a thin deposited film with less damage to a semiconductor layer on a substrate, use of a plasma exciting frequency more than 13.56 MHz is preferable, since the ion bombardment of a plasma can be lessened. However, too high a plasma exciting frequency may possibly cause a temperature rise in a semiconductor or a substrate due to high-frequency heating. Accordingly, for the realization of low-temperature, less-damage film formation, it is important to use a plasma exciting frequency within the VHF band. The inventors have carried out film formation using a VHF plasma of 40–100 MHz while flowing monosilane and nitrogen gases into a discharge space.

The interval between electrodes was set at 20 mm, substrate heating was not performed, and silane gas and nitrogen gas were flowed into a discharge space at flow rates of 200 sccm and 1000 sccm, respectively, while keeping the pressure inside the discharge space 133 Pa. Further, a VHF power was supplied to generate a plasma to form a silicon nitride film on a glass substrate.

As a result, a powder of silane polymer adhered to the glass substrate, and the deposition rate was as low as 1 Å/sec or less. Further, when increasing the pressure of the discharge space to over 133 Pa, there were generated non-deposition portions, so that no silicon nitride films with good quality could be obtained. The reason for this is that the silane source gas, when staying in a plasma for a long period of time, forms silicon polymers, so that deposition of silicon nitride is not performed. In order to make the silane source gas efficiently deposit as a silicon nitride film, it is necessary to decompose the nitrogen gas into radicals or ions and also to shorten the residence time of the silane gas in the plasma. Moreover, it is necessary to suppress the damage and heat generation of the organic film and the semiconductor layer caused by plasma ion collision.

The inventors have tried to reduce the interval between the electrodes to less than 20 mm so that the residence time of the silane gas in a plasma became shorter and have determined the deposition rate of a silicon nitride film. As a result, it was confirmed that although formation of a deposited film started when the interval was reduced to 15 mm, the thus formed silicon nitride film posed a problem of having a great stress and generating film peeling off and unevenness in film thickness. After additional the interval between the electrodes less than 8 mm, the stress of the silicon nitride film lowered to $3 \times 10^{10}$ dyn/cm$^2$ or less, so that no film peeling off was generated and the film thickness distribution was remarkably improved.

Then, the interval between the electrodes was set at 7 mm, and the state of formation of a deposited film was observed while varying the pressure of the reaction space within the range of 27 Pa to 266 Pa. As a result, it has been found that when the pressure was more than 133 Pa, peeling off of the film and unevenness in film thickness were generated, whereas when the pressure was 133 Pa or less, no peeling off of the silicon nitride film was generated and the film thickness distribution was remarkably improved.

Further, the characteristics as a passivation film of a silicon nitride film were observed while varying the ratio of the silane gas flow rate to the nitrogen gas flow rate from 1:5 to 1:50. As a result, when the ratio of the silane gas flow rate to the nitrogen gas flow rate was 1:5, there were created the problems of contamination of the film with silane polymer powder and cracking of the film. When the flow rate of the nitrogen gas was 10 or more times that of the silane gas, good silicon nitride films contamination and film peeling off. Then, the permeability of the formed film to water and oxygen was observed, and it was found that when the flow rate of the nitrogen gas was 30 or less times that of the silane gas, there was caused no breakage of an underlying semiconductor film and silicon nitride films with high water-blocking properties could be formed. The reason for this is that since the ionization potential of $N_2$ is as high as 15.6 eV, and since the dissociation energy of $SiH_4$ is as small as 2.1–13.2 eV, the plasma potential can be lowered by increasing the ratio of the silane gas flow rate to the nitrogen gas flow rate, which in turn suppresses the ion bombardment and overheating of the organic film or semiconductor layer and the silicon nitride film, thereby enabling formation of a dense nitride film.

Further, as described above, in order to effect film formation without an ascent of the plasma potential, it is necessary to lower the density of a power supplied to the high-frequency electrode. It has been found that a silicon nitride film formed with a power density of 40 to 150 mW/cm$^2$ has high water-blocking properties. Incidentally, when a silicon nitride film was formed with a power density of 200 mW/cm$^2$, the formed film had low water-blocking properties.

Further, when forming a silicon nitride film under the conditions described above, since the rise in the substrate temperature is suppressed to about 1° C./min, it becomes possible to form a thin film without imparting a thermal stress to an organic film or a semiconductor layer. This in turn makes it possible to form a silicon nitride film on products made using an organic film, or a semiconductor layer or resin substrate having poor heat-resistance.

The deposited film forming method of the present invention produces tremendous effect in the formation of insulating films or passivation films for products that are less resistant to the ion bombardment or heat of plasma.

FIGS. 1 to 5 are schematic views showing examples of the deposited film forming methods of the present invention. In FIGS. 1 to 5, reference numeral 1 denotes a vacuum vessel, reference numeral 2 a grounding electrode (substrate holder), reference numeral 3 a high-frequency electrode, reference numeral 4 a reaction space, reference numeral 5 a high-frequency power source, reference numeral 6 an exhaust means, reference numeral 7 a gas blowout hole, reference numeral 8 a matching box, reference numeral 11 a glass substrate, reference numeral 12 an aluminum electrode, reference numeral 13 an organic film, reference numeral 14 a transparent conductive film, reference numeral 15 a silicon nitride film, reference numeral 16 a resin substrate, reference numeral 17 a resin, reference numeral 18 an IC chip and reference numeral 19 a space.

In the apparatus shown in FIG. 1, a grounding electrode 2 serving as a substrate holder is provided in opposition to a high-frequency electrode 3, source gases are supplied from the top face of the high-frequency electrode 3, and the deposited film forming process is performed in a reaction space 4 by a high-frequency glow discharge using a high-frequency power of the VHF band. The interval between the high-frequency electrode 3 and the grounding electrode 2 is kept less than 8 mm, a product on which a thin film is to be formed is disposed on the substrate holder, silane gas and nitrogen gas are used as source gases, the flow rate of the nitrogen gas is set at 10 to 30 times that of the silane gas, and the density of the VHF high-frequency power is set at 40 mW/cm$^2$ to 150 mW/cm$^2$. Thus, forming a silicon nitride film makes it possible to lessen the ion damage to an organic film or a semiconductor layer and to suppress the heating of a resin substrate, so that a good-quality passivation film can be formed without heating the substrate.

The passivation film thus obtained can be preferably used especially for passivation of an organic EL element. Particularly, it can be used as a passivation film for protecting an organic material that is disposed between a pair of electrodes and contributes to the light emission of the organic EL element, from an external environment (specifically, from, for example, water, moisture, or oxygen). Since such a passivation film can be formed at low temperatures, the organic material will not be exposed to high temperatures during the formation of the passivation film.

Further, the organic EL element thus obtained can be used in a pixel portion or the like of an image display device such as a display. In that case, a plurality of organic EL elements is arranged two-dimensionally. The passive matrix driving, active matrix driving, or the like can drive such organic EL elements. Alternatively, the organic EL element can be used as an exposure light source for exposure of a photosensitive member of an electrophotographic image forming apparatus (e.g., a copying machine or laser beam printer). In that case, the exposure light source is preferably such that a plurality of organic EL elements is arranged in the longitudinal direction of the photosensitive member. Moreover, the organic EL element can be used in a one-chip exposure unit (an exposure unit obtained by forming plural EL elements on a single substrate). Such an exposure light source can also be used in an electrophotographic image forming apparatus capable of forming a color image.

EXAMPLES

In the following, examples of the present invention will be described. Although the interval between the high-frequency electrode and the grounding electrode also serving as the substrate holder specifically adopted in the examples ranges from 3 mm to 7 mm, the preferable range of the present invention is 8 mm or less as described above. Of course, the interval of 0 mm is outside the preferable range.

Example 1

One example of the present invention will be described with reference to FIG. 1.

With the deposited film forming apparatus of FIG. 1, the characteristics of silicon nitride films formed were observed while setting the interval between the high-frequency electrode 3 and the opposing grounding electrode 2 also serving as the substrate holder at various values within the range of 3 mm to 7 mm. For each sample, a glass substrate (trade name: Corning 7059; manufactured by Corning Glassworks) was set on the substrate holder. Then, after the vacuum vessel 1 was evacuated to 0.2 Pa or less, silane gas and nitrogen gas were flowed out uniformly from the gas blowout holes 7 provided on the top surface of the electrode 3 at flow rates of 50 sccm and 1000 sccm, respectively, while keeping the pressure of the reaction space 4 within the range of 40 Pa to 133 Pa. Further, a 60 MHz high-frequency power with a power density of 40 mW/cm$^2$ to 150 mW/cm$^2$ was supplied to the high-frequency electrode 3 to form a silicon nitride deposited film on the glass substrate without heating the substrate.

The plasma was stable, and films with good quality were formed which were free from powder adhesion and film peeling off and had thickness distributions of ±10% or less.

Example 2

Then, with the same deposited film forming apparatus as Example 1, the characteristics of silicon nitride films formed were observed with regard to various film forming pressures while fixing the interval between the high-frequency electrode 3 and the opposing grounding electrode 2 at 5 mm. A Corning 7059 glass substrate was set on the substrate holder. Then, after the vacuum vessel 1 was evacuated to 0.2 Pa or less, the ratio of the silane gas flow rate and the nitrogen gas flow rate was set to 1:20. Under various pressures of the reaction space 4 within the range of 40 Pa to 133 Pa, a 100 MHz high-frequency power with a power density of 40 mW/cm$^2$ to 150 mW/cm$^2$ was supplied to the high-frequency electrode 3 to form a silicon nitride deposited film on the glass substrate without heating the substrate.

During 10-minute film formation, the temperature of the substrate rose from 30° C. to 45° C. Silicon nitride films of good quality were formed which had good thickness distributions and were free from powder adhesion and film peeling off.

Example 3

With the deposited film forming apparatus of FIG. 1, the interval between the high-frequency electrode 3 and the opposing grounding electrode 2 was set at 7 mm. A Corning 7059 glass substrate was set on the substrate holder.

Then, after the vacuum vessel 1 was evacuated to 0.2 Pa or less, at various ratios of the silane gas flow rate to the nitrogen gas flow rate within the range of 1:10 to 1:30, the pressure of the reaction space 4 was controlled to 133 Pa. At each flow rate ratio, a high-frequency power with a power exciting frequency of 60 MHz and a power density of 40 mW/cm$^2$ to 150 mW/cm$^2$ was supplied to the high-frequency electrode 3 to form a silicon nitride deposited film on the glass substrate without heating the substrate.

The sample films formed were free from film peeling off and powder adhesion, and there was observed no abnormality.

Example 4

Then, with the deposited film forming apparatus of FIG. 1, the interval between the high-frequency electrode 3 and the opposing grounding electrode 2 was set at 3 mm and 7 mm, respectively. A glass substrate having an organic film formed thereon was used and disposed on the substrate holder. Then, for each electrode interval, after the vacuum vessel 1 was evacuated to 0.2 Pa or less, silane gas and nitrogen gas were flowed with the ratio of the silane gas flow rate to the nitrogen gas flow rate being set at various ratios between 1:10 and 1:30 within the range of the silane gas flow rate of 40–100 sccm and the nitrogen gas flow rate of 1000–1200 sccm, and the pressure of the reaction space 4 was controlled to 67 Pa. Then, for each flow rate ratio, a 60 MHz high-frequency power was supplied to the high-frequency electrode 3 to form a silicon nitride film of 6000–8000 Å in thickness on the organic film without heating the substrate at various power densities within the range of 40 mW/cm$^2$ to 150 mW/cm$^2$.

The temperature of the back surface of the sample was measured with a thermocouple during each was formed on the organic film at low temperatures up to 48° C., and there was observed no abnormality on the organic film of each sample.

Thereafter, for each sample, chloroform was dropped on the silicon nitride film formed on the organic film on the glass substrate to observe the water-blocking properties of the silicon nitride film. As a result, there was observed no change in each organic film, and it was confirmed that the films formed all had high water-blocking properties.

Example 5

Figure 2:
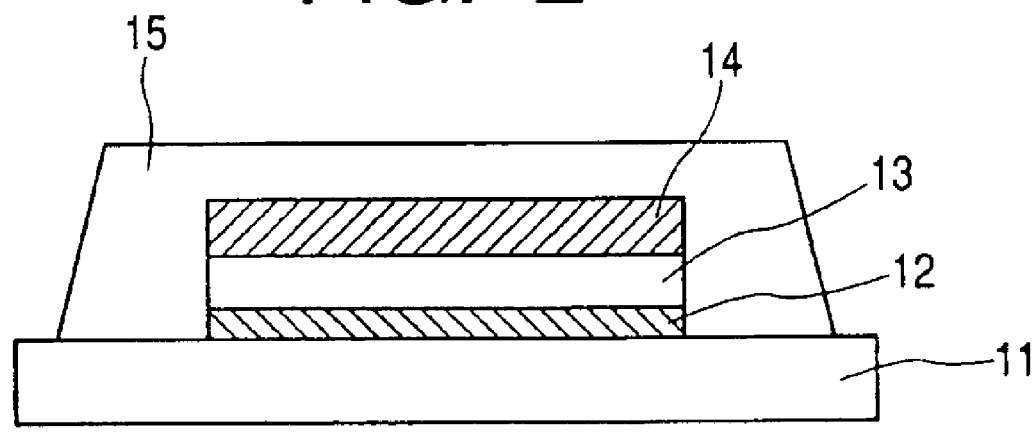
FIG. 2 is a schematic cross-sectional view of an organic EL element having a passivation film formed by practicing an embodiment of the silicon nitride film forming method of the present invention.
Figure 3:
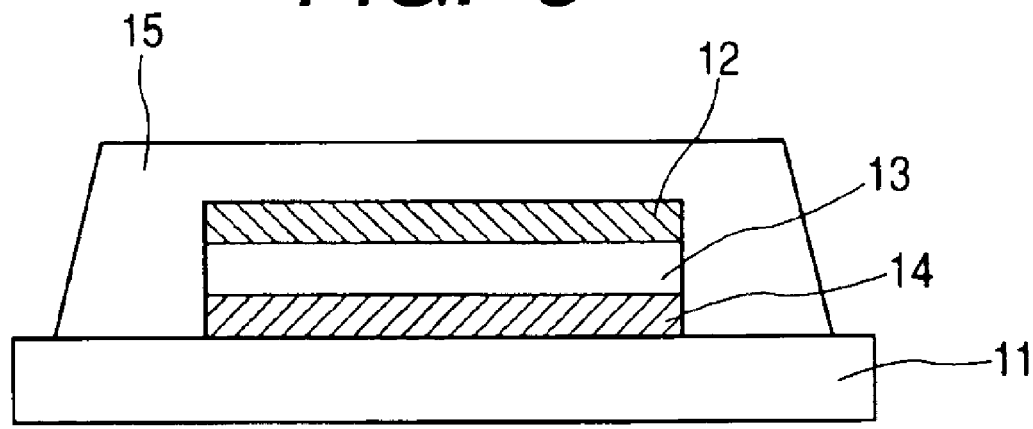
FIG. 3 is a schematic cross-sectional view of an organic EL element having a passivation film formed by practicing another embodiment of the silicon nitride film forming method of the present invention.
Figure 4:
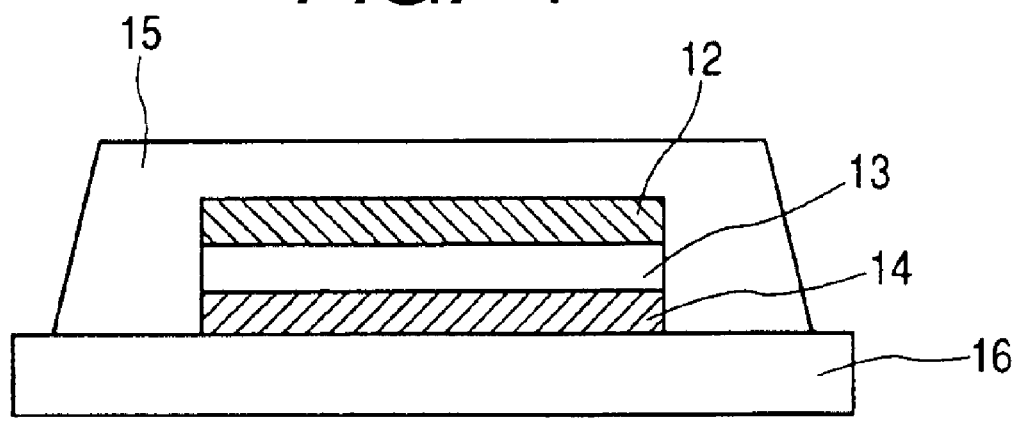
FIG. 4 is a schematic cross-sectional view of an organic EL element having a passivation film formed by practicing still another embodiment of the silicon nitride film forming method of the present invention.

The electrodes were spaced 7 mm apart from each other, and an organic EL element having a transparent conductive film 14 formed on an organic film 13 and an organic EL element having an aluminum electrode 12 formed on an organic film 13 were used and disposed in turn on the substrate holder. Then, for each organic EL element, after the vacuum vessel 1 was evacuated to 0.2 Pa or less, silane gas and nitrogen gas were flowed at flow rates of 50 sccm and 1000 sccm, respectively, while setting the ratio of the silane gas flow rate to the nitrogen gas flow rate at 1:20 and controlling the pressure of the reaction space 4 to 67 Pa. Then, a 60 MHz high-frequency power with a power density of 100 mW/cm$^2$ was supplied to the high-frequency electrode 3 to form a silicon nitride deposited film of 6800 to 7500 Å in thickness on each organic EL element, thereby obtaining samples as shown in FIG. 2 or 3, respectively, without heating the substrate.

Then, a continuous light emission test was conducted for each organic EL element at a room temperature of 25° C. and a relative humidity of 50%. After 500 hours elapsed, there was observed no spread of dark spots, and the results were the same as that of a bottle-sealed element. Further, the luminance-voltage characteristics were unchanged from the initial state, and the silicon nitride films formed had high water-blocking properties.

Example 6

Figure 5:
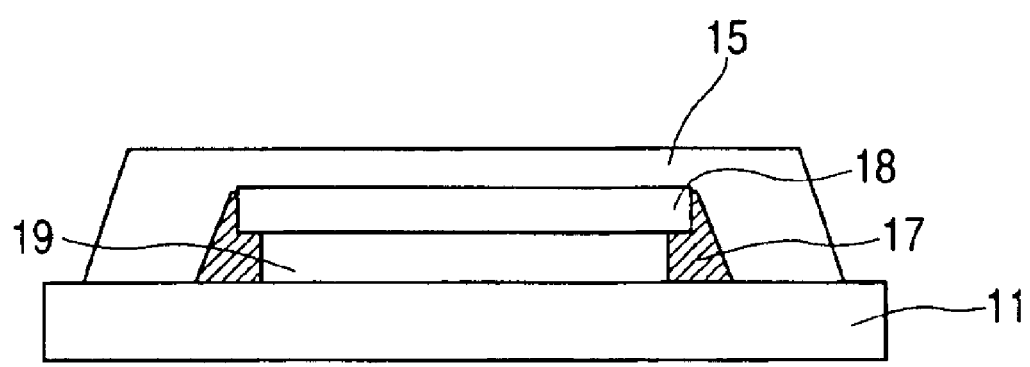
FIG. 5 is a schematic cross-sectional view of an IC having a passivation film formed by practicing yet still another embodiment of the silicon nitride film forming method of the present invention.

The electrodes were spaced 7 mm apart, and a sample obtained by sealing a glass substrate and an IC with a resin was disposed on the substrate holder. Then, after the vacuum vessel 1 was evacuated to 0.2 Pa or less, silane gas and nitrogen gas were flowed out from the gas blowout holes 7 of the electrode 3 at flow rates of 100 sccm and 1000 sccm, respectively, while setting the ratio of the silane gas flow rate to the nitrogen gas flow rate at 1:10 and controlling the pressure of the reaction space 4 to 133 Pa. Then, a 60 MHz high-frequency power with a power density of 100 mW/cm was supplied to the high-frequency electrode 3 to form a silicon nitride deposited film of 3 µm in thickness on the IC element, thereby obtaining a sample as shown in FIG. 5, without heating the substrate.

The resin surface of the IC sample was observed with an optical microscope, but no abnormality was found.

Thereafter, the IC sample was left stand at a temperature of 65° C. and a relative humidity of 95% for 24 hours. Then, the temperature of the IC sample was decreased to room temperature, but no water droplet could be found between the IC and the glass substrate.

Comparative Example

The interval between the electrodes was set at 10 mm, the flow rate of each gas and the pressure of the reaction space were set at the same values as in Example 5, and a 60 MHz high-frequency power with a power density of 200 mW/cm$^2$, which is twice that of Example 5, was supplied to the high-frequency electrode 3 to form a silicon nitride deposited film of 7000 Å in thickness on an organic EL element, without heating the substrate.

Then, a continuous light emission test was conducted for the organic EL element at room temperature of 25° C. and a relative humidity of 50%. After 500 hours elapsed, there was observed spread of dark spots reaching about 30% of the element area. Thus, no silicon nitride film with high water-blocking properties could be formed under the condition of a high frequency power of more than 150 mW/cm$^2$.

As described above with reference to the embodiments and examples, according to the deposited film forming method of the present invention, a silicon nitride film can be provided that can be formed at low temperatures and has high water-blocking properties and a uniform thickness, and moreover a high deposition rate can be attained with less electric power.

Further, according to the present invention, in a method of forming a silicon nitride deposited film using the capacitive coupled plasma enhanced CVD process, by disposing a plate high-frequency electrode for supplying a high-frequency power of the VHF band and a grounding electrode in opposition to each other at an interval of less than 8 mm in a vacuum vessel, introducing at least a silane-based gas and nitrogen gas as source gases into a reaction space of the vacuum vessel, setting the pressure of the reaction space at 40 to 133 Pa, setting the density of a power supplied to the high-frequency electrode at 40 to 150 mW/cm$^2$, and forming a silicon nitride deposited film with the flow rate of the nitrogen gas being 10 to 30 times that of the silane-based gas, it is possible to lessen ion damage to an organic film or a semiconductor layer and also to suppress heating of a resin substrate, so that it becomes possible to form a passivation film of good quality without heating the substrate.

Further, according to the present invention, an organic electroluminescent device can be produced and provided which has a silicon nitride film as a good passivation film.

What is claimed is:

1. A method of forming a silicon nitride deposited film using the capacitive coupled plasma enhanced CVD process, which comprises disposing a plate high-frequency electrode for supplying a high-frequency power of the VHF band and a grounding electrode in opposition to each other at an interval of less than 8 mm in a vacuum vessel, introducing at least a silane-based gas and nitrogen gas as source gases into a reaction space of the vacuum vessel, and forming a silicon nitride deposited film with the pressure of the reaction space being kept at 40 to 133 Pa.

2. The method according to claim 1, wherein a density of a power supplied to the high-frequency electrode is 40 to 150 mW/cm$^2$.

3. The method according to claim 2, wherein the flow rate of the nitrogen gas is 10 to 30 times that of the silane-based gas.

4. The method according to claim 1, wherein the temperature of a substrate on which the silicon nitride film is deposited is 80° C. or less.

5. The method according to claim 1, wherein the silicon nitride film is formed on another deposited film comprising an organic film.

6. A method of producing an organic electroluminescent device having an organic electroluminescent element provided on a substrate, comprising:

the element forming step of forming on a substrate an organic electroluminescent element comprising a pair of electrodes and an organic material interposed between the pair of electrodes; and the silicon nitride film forming step, subsequently to the element forming step, of forming a silicon nitride film so as to cover the organic electroluminescent element, wherein the silicon nitride film forming step comprises disposing a plate high-frequency electrode for supplying a high-frequency power of the VHF band and a grounding electrode in opposition to each other at an interval of less than 8 mm in a vacuum vessel, introducing at least a silane-based gas and nitrogen gas as source gases into a reaction space of the vacuum vessel, and forming a silicon nitride film with the pressure of the reaction space being kept at 40 to 133 Pa.

7. The method according to claim 6, wherein of the pair of electrodes of the electroluminescent element, the electrode on the substrate side is a reflecting electrode and the other electrode is a transparent electrode.

8. The method according to claim 7, wherein the silicon nitride film covers not only the transparent electrode but also a side portion of the organic electroluminescent element.

* * * * *

UNITED STATES PATENT AND TRADEMARK OFFICE
CERTIFICATE OF CORRECTION

PATENT NO. : 6,881,684 B2  
DATED : April 19, 2005  
INVENTOR(S) : Yukito Aota et al.

Page 1 of 1

It is certified that error appears in the above-identified patent and that said Letters Patent is hereby corrected as shown below:

Column 1,
Line 63, "F" should read -- F (sccm). This method is to reduce the ratio of the --.

Column 3,
Line 3, "nitrogen" should read -- nitrogen gas as a source gases into a reaction space of the --.

Column 4,
Line 9, "additional" should read -- additional research, the inventors have found that when reducing --; and
Line 31, "films" should read -- films were obtained which were free from powder --.

Column 7,
Line 25, "each" should read -- each film formation to confirm that a silicon nitride film --.

Column 8,
Line 8, "mW/cm" should read -- $mW/cm^2$ --.

Signed and Sealed this

Thirtieth Day of August, 2005

JON W. DUDAS
*Director of the United States Patent and Trademark Office*